United States Patent
Minoura et al.

(10) Patent No.: US 9,156,743 B2
(45) Date of Patent: Oct. 13, 2015

(54) CARBON COMPONENT AND METHOD FOR MANUFACTURING THE SAME

(75) Inventors: Seiji Minoura, Ogaki (JP); Jun Ohashi, Ogaki (JP); Toshiki Ito, Ogaki (JP); Koji Ishida, Ogaki (JP); Fumihito Ogawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 1184 days.

(21) Appl. No.: 13/090,261

(22) Filed: Apr. 20, 2011

(65) Prior Publication Data
US 2011/0259270 A1    Oct. 27, 2011

(30) Foreign Application Priority Data

Apr. 21, 2010    (JP) .................................. 2010-098080

(51) Int. Cl.
*C23F 1/00*  (2006.01)
*H01L 21/306*  (2006.01)
(Continued)

(52) U.S. Cl.
CPC ............. *C04B 41/009* (2013.01); *C04B 37/005* (2013.01); *C04B 37/008* (2013.01); *C04B 41/5057* (2013.01); *C04B 41/5059* (2013.01); *C04B 41/5062* (2013.01); *C04B 41/5064* (2013.01); *C04B 41/87* (2013.01); *C23C 14/505* (2013.01); *C23C 16/458* (2013.01); *C23C 16/4581* (2013.01); *C23C 16/4582* (2013.01); *C23C 16/4583* (2013.01); *C23C 16/4584* (2013.01); *C23C 16/4588* (2013.01); *C30B 25/12* (2013.01); *C30B 35/00* (2013.01); *C04B 2235/72* (2013.01); *C04B 2237/08* (2013.01); *C04B 2237/083* (2013.01); *C04B 2237/086* (2013.01); *C04B 2237/363* (2013.01);
(Continued)

(58) Field of Classification Search
CPC ............. C23C 14/505; C23C 16/4584; C23C 16/4588; C23C 16/458; C23C 16/4581; C23C 16/4582; C23C 16/4583
USPC ................. 118/728, 730; 156/345.51, 345.55
See application file for complete search history.

(56) References Cited

U.S. PATENT DOCUMENTS 4,773,852 A * 9/1988 Tanji et al. ..................... 432/263
4,978,567 A * 12/1990 Miller ............................ 428/157
(Continued)

FOREIGN PATENT DOCUMENTS

CN         1702193        11/2005
CN       101207061         6/2008
(Continued)

OTHER PUBLICATIONS

Korean Office Action for corresponding KR Application No. 10-2011-37125, Mar. 28, 2013.
(Continued)

*Primary Examiner* — Rudy Zervigon
(74) *Attorney, Agent, or Firm* — Mori & Ward, LLP

(57) ABSTRACT

A carbon component having a hole therein and an outer surface covered with a ceramic coating, and a method for manufacturing the carbon component are provided. The carbon component includes two carbon plate members joined together. The hole is defined by a groove formed on a mating surface of at least one of the carbon plate members and a mating portion of the other of the carbon plate members, which opposes the groove. An inner surface of the hole including a surface of the groove is entirely covered with a ceramic coating.

24 Claims, 7 Drawing Sheets

(51) Int. Cl.

| | | |
|---|---|---|
| *C04B 41/00* | (2006.01) | |
| *C23C 14/50* | (2006.01) | |
| *C23C 16/458* | (2006.01) | |
| *C04B 37/00* | (2006.01) | |
| *C04B 41/50* | (2006.01) | |
| *C04B 41/87* | (2006.01) | |
| *C30B 25/12* | (2006.01) | |
| *C30B 35/00* | (2006.01) | |

(52) U.S. Cl.
 CPC ......... *C04B2237/64* (2013.01); *C04B 2237/72* (2013.01); *C04B 2237/86* (2013.01); *Y10T 156/1039* (2015.01)

(56) References Cited

U.S. PATENT DOCUMENTS

| | | | | |
|---|---|---|---|---|
| 5,134,044 | A * | 7/1992 | Megerle | 429/104 |
| 5,280,156 | A * | 1/1994 | Niori et al. | 219/385 |
| 5,374,594 | A | 12/1994 | van de Ven et al. | |
| 5,800,618 | A * | 9/1998 | Niori et al. | 118/723 E |
| 6,054,700 | A * | 4/2000 | Rokhvarger et al. | 219/759 |
| 6,087,034 | A * | 7/2000 | Mercuri | 429/514 |
| 6,120,640 | A * | 9/2000 | Shih et al. | 156/345.1 |
| 6,140,624 | A * | 10/2000 | Gilbert, Sr. | 219/553 |
| 6,410,172 | B1 * | 6/2002 | Gilbert, Sr. | 428/698 |
| 6,508,884 | B2 * | 1/2003 | Kuibira et al. | 118/725 |
| 7,337,745 | B1 * | 3/2008 | Komino et al. | 118/723 E |
| 8,021,487 | B2 * | 9/2011 | Boguslavskiy et al. | 118/730 |
| 2002/0160250 | A1 * | 10/2002 | Woods | 429/38 |
| 2002/0192457 | A1 * | 12/2002 | Temme | 428/320.2 |
| 2003/0064010 | A1 * | 4/2003 | Allen | 422/190 |
| 2003/0085206 | A1 | 5/2003 | Kosakai | |
| 2003/0106799 | A1 * | 6/2003 | Covington et al. | 204/600 |
| 2003/0188687 | A1 | 10/2003 | Paisley et al. | |
| 2003/0198857 | A1 * | 10/2003 | McManus et al. | 429/38 |
| 2005/0181617 | A1 | 8/2005 | Bosch | |
| 2006/0102081 | A1 * | 5/2006 | Ueno et al. | 118/728 |
| 2007/0062455 | A1 * | 3/2007 | Saxler | 118/730 |
| 2008/0035632 | A1 | 2/2008 | Fujita et al. | |
| 2009/0155028 | A1 * | 6/2009 | Boguslavskiy et al. | 414/223.01 |
| 2010/0047448 | A1 * | 2/2010 | Morisaki et al. | 427/248.1 |
| 2011/0114022 | A1 * | 5/2011 | Boguslavskiy et al. | 118/724 |
| 2011/0259270 | A1 * | 10/2011 | Minoura et al. | 118/728 |
| 2011/0272396 | A1 * | 11/2011 | Bunuel Magdalena et al. | 219/622 |
| 2011/0300297 | A1 * | 12/2011 | Celaru et al. | 427/255.5 |
| 2013/0243663 | A1 * | 9/2013 | Dannoux et al. | 422/502 |

FOREIGN PATENT DOCUMENTS

| | | |
|---|---|---|
| JP | 08-051082 | 2/1996 |
| JP | 4071919 B2 | 1/2002 |
| JP | 2003-124296 | 4/2003 |
| JP | 2004-200436 | 7/2004 |
| KR | 10-1995-0034491 | 12/1995 |
| KR | 10-2003-0038436 | 5/2003 |
| KR | 10-2004-0066093 | 7/2004 |
| TW | 2006-06274 | 2/2006 |
| TW | 2008-34804 | 8/2008 |

OTHER PUBLICATIONS

Chinese Office Action for corresponding CN Application No. 201110100396.3, Nov. 22, 2012.

* cited by examiner

CARBON COMPONENT AND METHOD FOR MANUFACTURING THE SAME

CROSS-REFERENCE TO RELATED APPLICATION

This application claims priority from Japanese Patent Application No. 2010-098080, filed on Apr. 21, 2010, the entire subject matter of which is incorporated herein by reference.

BACKGROUND OF THE INVENTION

1. Field of the Invention

The present invention relates to a carbon component and a method for manufacturing the carbon component.

2. Description of the Related Art

In a CVD system for epitaxially growing silicon or a compound semiconductor wafer, a susceptor has been used for mounting thereon a wafer. A conductive graphite base material has generally been used in the susceptor for generating heat by means of induction heating. Since graphite exhibits low electrical resistance, high heat resistance and chemical stability, it can be preferably used in such a field of CVD system. However, since a process rate is important for epitaxial growth, wafers are exchanged even at a relatively high temperature before an interior of the CVD system is sufficiently cooled, so that the susceptor is exposed to the atmosphere while still remaining heated. Therefore, if the graphite is used for a base material as it is, there will arise a problem of the base material reacting with air, to thus become heavily deteriorated. In a system of using a CVD susceptor for epitaxial growth of gallium nitride, and the like, ammonium is used as a source gas. When decomposed by heat, ammonium produces hydrogen and nitrogen. Although nitrogen is used as a source gas for a gallium nitride film, hydrogen reacts with the graphite at a high temperature, to thus produce a hydrocarbon gas, like methane. Therefore, the graphite is eroded. For this reason, in order to prevent reaction of the atmosphere or hydrogen with graphite, the susceptor made of graphite is coated with ceramic, like SiC (see, for instance, JP-B-4071919 or JP-A-2004-200436). The contents of JP-B-4071919 and JP-A-2004-200436 are incorporated herein by reference.

SUMMARY OF THE INVENTION

An illustrative embodiment of the present invention has been made in view of the above circumstances. According to an illustrative embodiment, there is provided a carbon component that can be used with less deterioration even in an atmosphere including an oxidizing gas or a decomposable gas, and in particular, that is likely to prevent generation of particles from the inside of an elongated hole, by forming a coating on an inner surface of the elongated hole of the carbon component.

According to an illustrative embodiment of the present invention, there is provided a carbon component having a hole therein and an outer surface covered with a ceramic coating comprises two carbon plate members joined together, wherein the hole is defined by a groove formed on a mating surface of at least one of the carbon plate members and a mating portion of the other of the carbon plate members, which opposes the groove, and wherein an inner surface of the hole including a surface of the groove is entirely covered with a ceramic coating.

According to another illustrative embodiment of the present invention, there is provided a method for manufacturing a carbon component having a hole therein and an outer surface covered with a ceramic coating comprises: preparing two carbon plate members, each having a mating surface to be joined together; forming a groove on the mating surface of at least one of the carbon plate members; purifying the carbon plate members to remove impurity from the carbon plate members; forming a ceramic coating on the groove of the at least one of the carbon plate members, a mating portion of the other of the carbon plate members, which opposes the groove, and an outer surface of the carbon plate members at least except for the mating surface; and joining the carbon plate members together while the mating surfaces oppose each other.

BRIEF DESCRIPTION OF THE DRAWINGS

The above and other aspects of the present invention will become more apparent and more readily appreciated from the following description of illustrative embodiments of the present invention taken in conjunction with the attached drawings, in which.

DETAILED DESCRIPTION

Figures 1A, 1B:
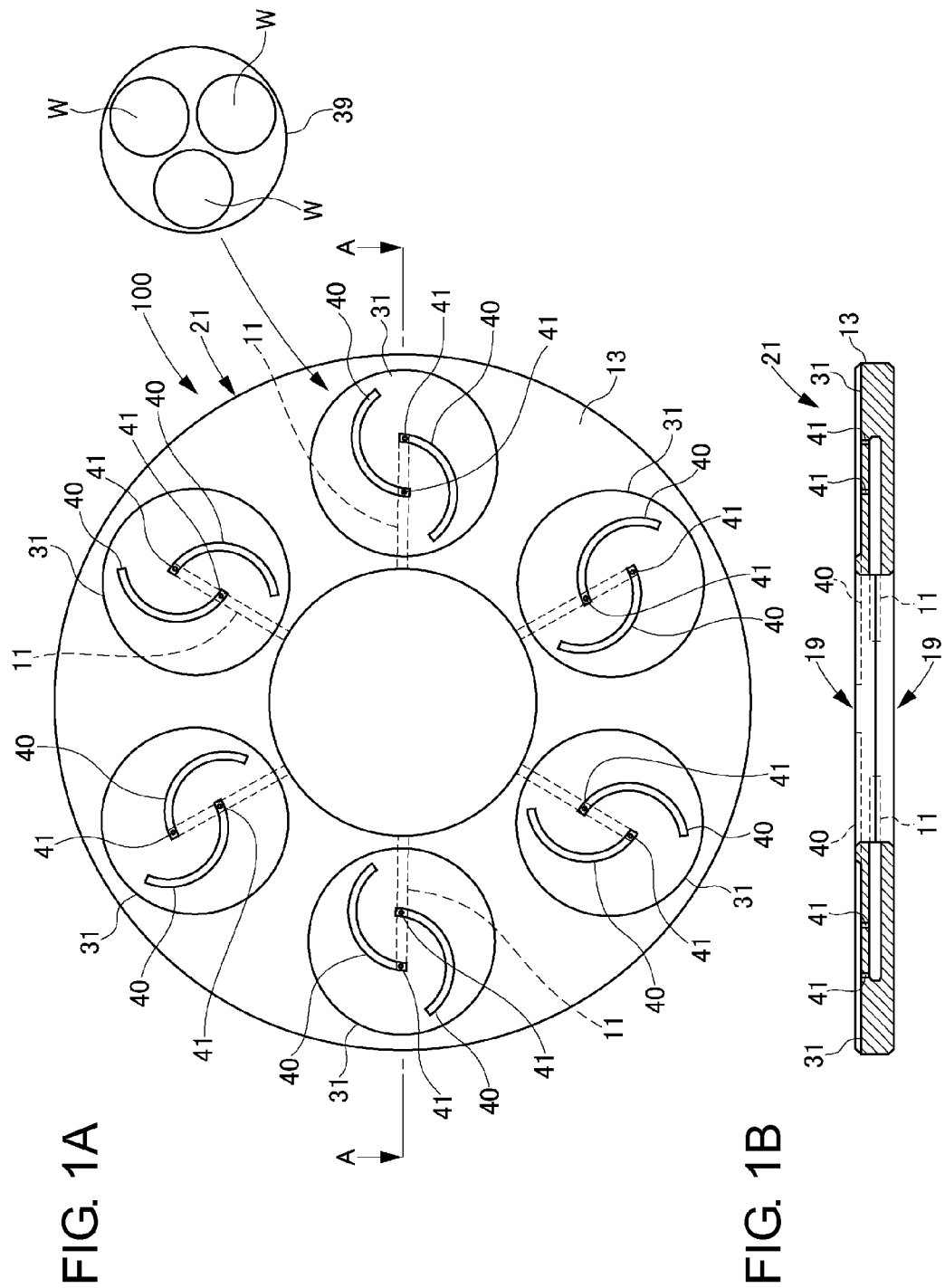
FIG. 1A is a plan view of a carbon component according to an illustrative embodiment of the present invention.
FIG. 1B is a cross sectional view taken along line A-A shown in FIG. 1A.

The susceptor of a CVD system is structured to be able to mount thereon a plurality of wafers. Although some simple susceptor has a structure for mounting thereon a plurality of wafers directly on the susceptors. Another susceptor has a structure, in order to enhance uniformity of film thickness of the wafer, for making a film uniform by rotating a wafer or a wafer carrier on the susceptor by utilization of a gas flow in addition to rotation of (revolution) of the entire susceptor. In such a susceptor, a gas is introduced into an inside of the susceptor from the outside, the gas is discharged from a vertical hole (an outlet nozzle) formed substantially at a center of a mount surface of the wafer or the wafer carrier, to thus exit while generating a vortex in a space between the wafer or the wafer carrier and the susceptor. On this occasion, the vortex of gas imparts rotational energy to the wafer, whereby the wafer can rotate on the susceptor. In order to enable passage of the gas, gas inlet hole is formed in the susceptor from a gas inlet part formed in a side surface of the susceptor to a neighborhood of a center of the wafer mount surface (or wafer carrier). The gas inlet hole is formed in the side surface of the susceptor by boring, with a drill, an elongated hole that passes through a position located immediately below the neighborhood of the center of the wafer mount surface (or the wafer carriers), boring a vertical hole for establishing a connection of the center of the wafer mount surface (or the wafer carrier) with the elongated hole, and sealing an end of the elongated hole.

In addition to boring of the elongated hole, a base material used as a susceptor (referred to as a susceptor base material) is subjected to another shape machining. Further, a ceramic coating, like a SiC-CVD film, a TaC-CVD film, and a pyrolytic carbon film, is formed on a surface of the susceptor base material, thereby completing a susceptor that can be used in a CVD system for epitaxial growth.

In a carbon component having the elongated hole, it tends to be difficult to form the ceramic coating deep into the hole. Specifically, in order to form a ceramic coating on the surface of the carbon component, the susceptor base material is loaded into a CVD furnace for forming a coating. After heating of the base material, for instance, for a SiC coating, a silane-based source gas and a hydrocarbon-based source gas are introduced into the furnace. It is noted that the CVD furnace used at this time is for forming a ceramic coating on a base material of graphite and is totally different from the CVD furnace for epitaxial growth. The source gas introduced into the CVD furnace becomes decomposed upon contacting with the hot base material, to thus build up on the base material and form a ceramic coating. A ceramic coating is formed at high speed on a front surface of the base material to be supplied with a source gas. However, the ceramic coating is formed at low speed on a back surface, a deep interior of a recess (hole), and the like, where the source gas is difficult to reach and a coating generally tends to become thinner. Further, the source gas for a ceramic coating enters the gas inlet hole of the susceptor from a small hole, to thus proceed to a deep side while contacting and building up on the wall surface of the elongated hole. For this reason, the concentration of the supplied source gas becomes low at a deep position in the elongated hole, and the source gas becomes hard to reach the deep position, so that the ceramic coating might not be formed.

When the carbon component is used in an atmosphere including an oxidizing gas and a decomposable gas, the outer surface of the carbon component having such an elongated hole is protected by a ceramic coating. However, the inner surface of the elongated hole that is not protected by the ceramic coating is likely to undergo oxidation and decomposition, and thickness reduction starts from the inner surface of the elongated hole, which is likely to cause damage that extends over the entire component with time.

If the carbon component is a susceptor having an elongated hole for epitaxial growth and if a coating is not formed over the elongated hole, the susceptor contacts the outside air at replacement of wafers, and when hydrogen is used for rotating the wafer or the wafer carrier by means of a gas vortex, an inner wall of the elongated hole is likely to become oxidized, decomposed, and deteriorated. Since the graphite base material is a porous material, the material does not become uniformly deteriorated from its surface, so that the deterioration tends to be accompanied by separation of particles. For this reason, the thus-separated particles spread as graphite particles over the interior of the CVD furnace for epitaxial growth, and the particles adhere to the wafer. If an epitaxial film is formed over the wafer with the particles, the particles are likely to cause defects. If the particles float within a hot zone, the particles are like to act in the air as nuclei for depositing the source gas. Then, the nuclei are likely to be deposited on the wafer, to thus cause crystal defects.

Next, illustrative embodiments of the present invention will be described by reference to the drawings.

Figures 2A, 2B:
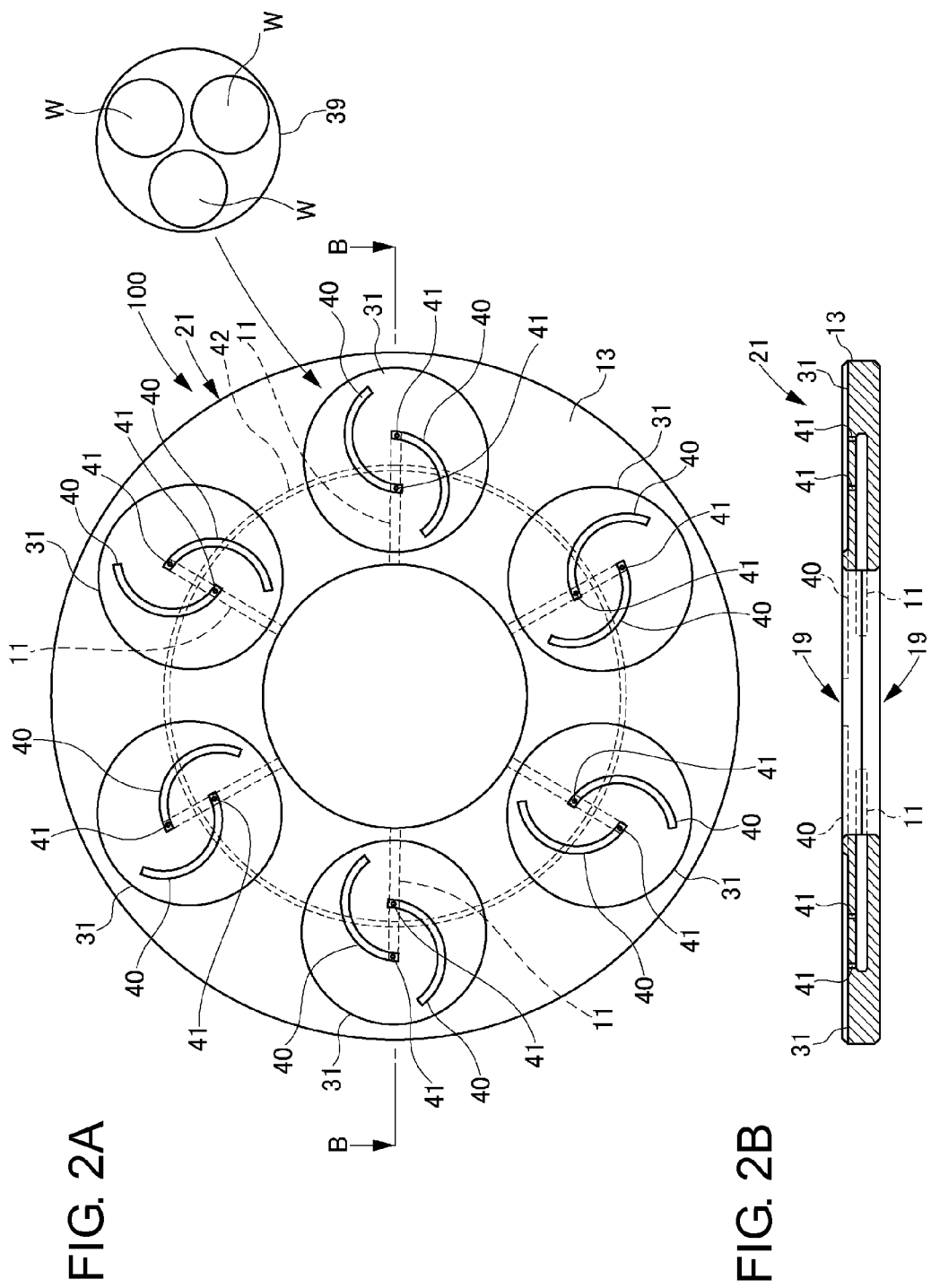
FIG. 2A is a plan view of a modification of the carbon component shown in FIG. 1.
FIG. 2B is a cross sectional view taken along line B-B shown in FIG. 2A.

FIG. 1A is a plan view of a carbon component according to an illustrative embodiment of the present invention, FIG. 1B is a cross sectional view taken along line A-A shown in FIG. 1A, FIG. 2A is a plan view of a modification of the carbon component shown in FIG. 1, and FIG. 2B is a cross sectional view taken along line B-B shown in FIG. 2A.

A carbon component 100 according to an illustrative embodiment of the present invention may be preferably used as a wafer holding member (a susceptor for epitaxial growth) that is heated by means of high frequency induction, a heater, and the like, in order to hold and heat a semiconductor wafer. The carbon component 100 is herein also referred to as a susceptor 100. As shown in FIGS. 1A and 1B, the susceptor 100 has a plurality of wafer mount surfaces 31 (six wafer mount surfaces in this illustrated embodiment) arranged at a substantially equal interval along a circumferential direction on one surface of a substantially disc-shaped plate member 21. The susceptor 100 introduces a gas from the outside and discharges the gas from two positions provided at a substantial center of each of the wafer mount surfaces 31. The gas is discharged while a vortex is produced along substantially semicircular grooves 40 formed between a wafer carrier 39 to be described later and the susceptor 100. The wafer carrier 39 is placed on the wafer mount surface 31 while holding a plurality of wafers W (three wafers in this illustrated embodiment). On this occasion, the wafers W are rotated in association with rotation of the wafer carrier 39 applied with rotational energy by the gas vortex and rotation of the susceptor 100.

In order to enable the passage of the gas, holes 11 for introducing a gas are formed within the susceptor 100 so as to extend from an unillustrated gas introduction device to the wafer mount surfaces 31. Each of the holes 11 is connected to vertical holes 41 at two substantially center positions of each of the wafer mount surfaces 31, and an end of each of the holes 11 is sealed, whereby the holes are formed.

As shown in FIGS. 1A and 1B, the hole 11 is formed as a hole 11 extending linearly in a radial direction. However, as shown in FIGS. 2A and 2B, the hole 11 may be formed so as to cross a substantially circular hole 42 that passes through center portions of the respective wafer mount surfaces 31. Forming such holes 11 and 42 are likely to allow an amount of gas flow in the respective holes 11 and 42 to be substantially uniform, so that variation in rotational speed is likely to be reduced.

FIGS. 3A to 3F are schematic views showing example shapes of the holes in the carbon components according to illustrative embodiments of the present invention and example positional relationships between the holes and mating surfaces 23.

The susceptor 100 has the holes 11 therein, and an outer surface 13 thereof (see FIG. 2) is covered with a ceramic coating to be described later. The plate member 21 is formed by joining two carbon plate members 19, 19 made of graphite. A hole 11 is defined by a groove 25 formed on the mating surface 23 of at least one of the carbon members 19 and a mating portion 27 of the other of the carbon members 19, which opposes the groove 25. The ceramic coating covers a substantially entire inner surface of the hole 11 including a surface of the groove 25.

Figure 3A:
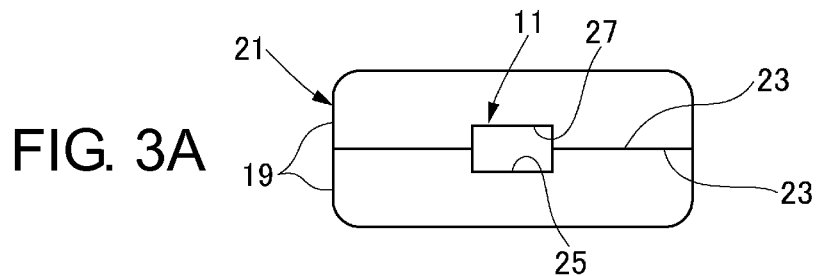
FIGS. 3A to 3F are schematic views showing example shapes of holes in the carbon components according to illustrative embodiments of the present invention and example positional relationships between the holes and mating surfaces.
Figure 3B:
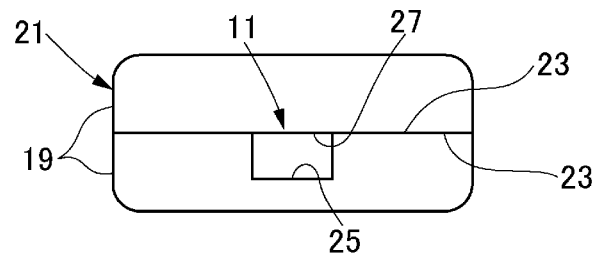
Figure 3C:
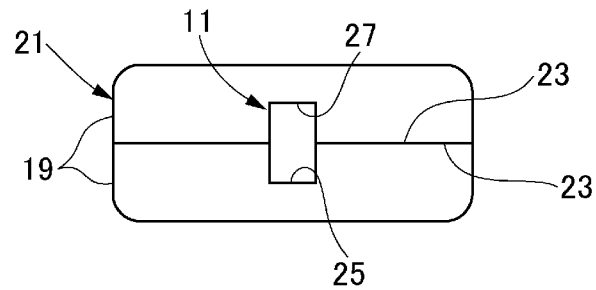
Figure 3D:
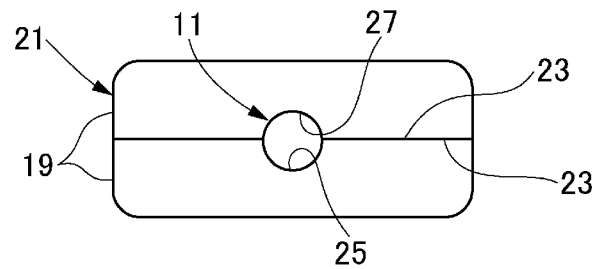
Figure 3E:
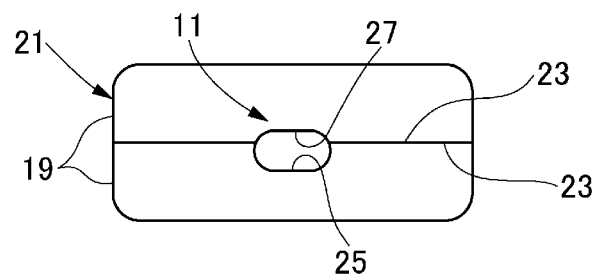
Figure 3F:
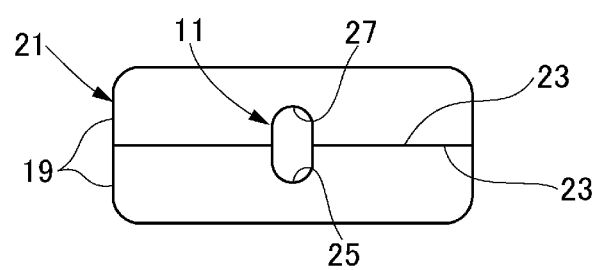

A cross sectional shape of the hole 11 that is orthogonal to an axial (extending) line of the hole may be a substantially square shape shown in FIGS. 3A, 3B, and 3C, a substantially circular shape shown in FIG. 3D, or a substantially oval shape shown in FIGS. 3E and 3F. A positional relationship between the hole 11 and the mating surfaces 23 may be any one of the following relationships; namely, a first relationship where the hole 11 is symmetrically divided by the mating surfaces 23 as shown in FIGS. 3A, 3C, 3D and 3F; a second relationship where the hole 11 (namely, the groove 25) is formed in only one mating surface 23 as shown in FIG. 3B; and a third relationship where the hole 11 is formed while deviating to one side with respect to the mating surface 23 as shown in FIG. 3E. As mentioned above, the groove 25 may be formed on both separated components or only on one of the separated components.

Figure 4A:
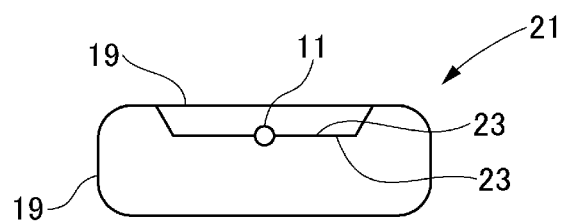
FIGS. 4A to 4C are schematic views showing example separation of the carbon component according to an illustrative embodiment of the present invention.
Figure 4B:
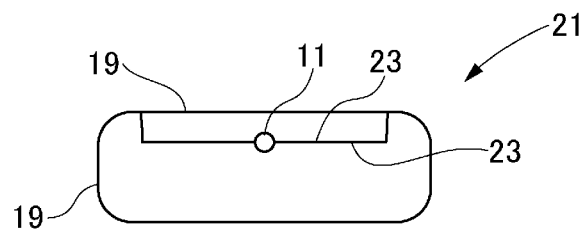
Figure 4C:
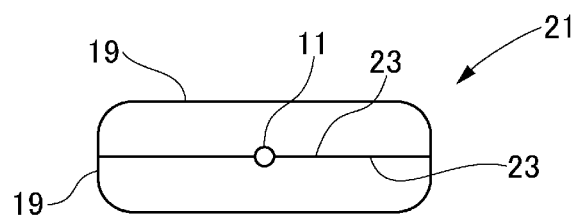

FIGS. 4A, 4B, and 4C are schematic views showing example separation of the carbon component according to an illustrative embodiment of the present invention. As shown in FIGS. 4A and 4B, the mating surfaces 23 are preferably a flat plane including the center axis of the hole 11. So long as the mating surfaces 23 are a flat plane including the center axis of the hole 11, the separated components become symmetrical with respect to the mating surfaces 23, and therefore, stress stemming from heating is likely to be exerted in a symmetrical manner, so that deformation of the component is likely to be reduced or prevented. As shown in FIG. 4C, the mating surfaces 23 are preferably located at a position where the thickness of the plate member 21 is divided into substantially half. In this case, since each of the carbon members is likely to be sufficiently made thick, warpage of the carbon member is likely to be reduced, so that the carbon members are likely to be easily joined together.

As shown in FIGS. 4A and 4B, the mating surfaces 23 may also be located at a position where the thickness of the plate member 21 is not divided into substantially half. In this case, when deformation, such as warpage, has occurred in the carbon member 19 due to stress, a mating surface of, particularly, the thinner carbon member may be subjected to surface processing to be flat plane after a ceramic coating has been formed over the graphite base material, thereby correcting the warpage and enabling joining of the carbon members.

The hole 11 may have opening at both ends; namely, an inlet and an outlet, or only on one side. A preferred ratio (L/D) of a depth (length:L) of the hole with respect to a diameter (D) of the hole 11 may be about 20 or more. When the ratio (L/D) of the depth (L) with respect to the diameter (D) is about 20 or more, the source gas of CVD becomes difficult to reach a deep position (a deep interior) of the hole 11. However, by adopting the configuration of the present invention, it is likely to form a ceramic coating substantially uniformly over the substantially entire inner surface of the hole.

The internal diameter of the hole 11 is not limited to a substantially uniform diameter. The hole 11 may have a shape that has an opening of small internal diameter and an interior space of large internal diameter or a gourd shape having a narrowed midsection. When the hole 11 has a gourd shape, consideration should be given to a depth from the narrow midsection. A preferred ratio (L/D) of a depth (length:L) from the narrow midsection with respect to the diameter (D) of the narrowed midsection may be about 20 or more.

Figure 5A:
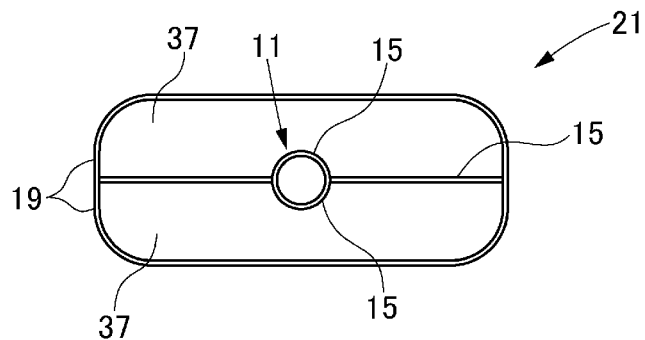
FIG. 5A is a schematic view of the carbon component according to an illustrative embodiment of the present invention, in which a ceramic coating is formed over the mating surface.
Figure 5B:
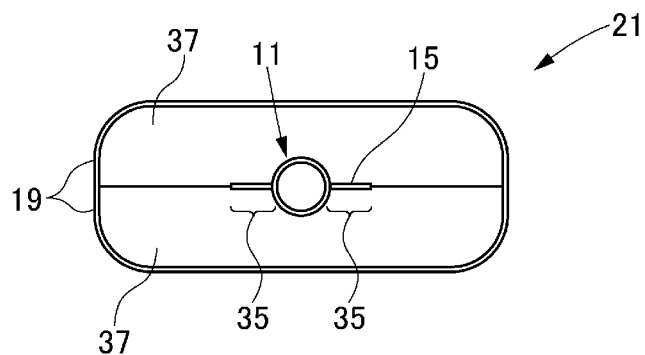
FIG. 5B is a schematic view of the carbon component according to an illustrative embodiment of the present invention, in which a ceramic coating is formed on only an area of the mating surface adjacent to the hole.
Figure 5C:
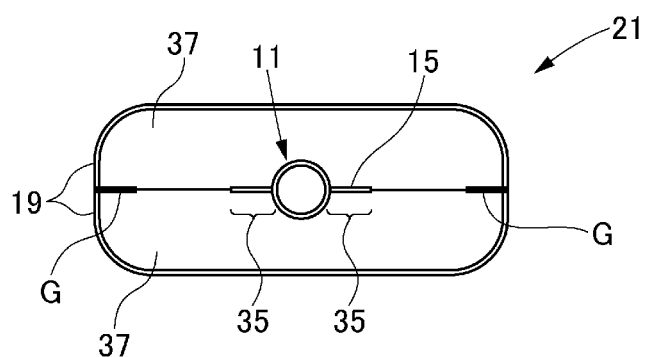
FIG. 5C is a schematic view of the carbon component according to an illustrative embodiment of the present invention, in which a ceramic coating is formed on only an area of the mating surface adjacent to the hole and an area of the mating surface adjacent to an outer surface of the carbon component.
Figure 5D:
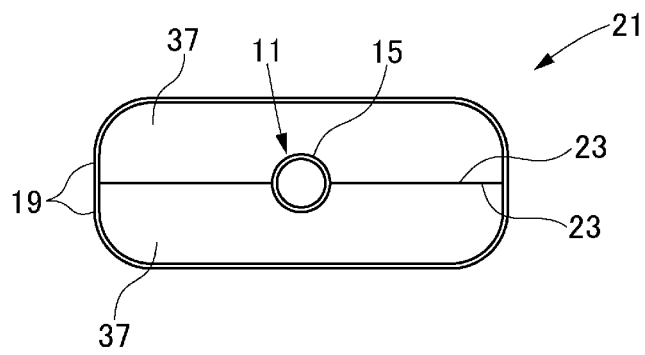
FIG. 5D is a schematic view of the carbon component according to an illustrative embodiment of the present invention, in which a ceramic coating is not formed on the mating surface.

FIG. 5A is a schematic view of the carbon component according to an illustrative embodiment of the present invention, in which a ceramic coating is formed over the mating surfaces, FIG. 5B is a schematic view of the carbon component according to an illustrative embodiment of the present invention, in which a ceramic coating is formed on only the area of mating surfaces adjacent to the hole, FIG. 5C is a schematic view of the carbon component according to an illustrative embodiment of the present invention, in which a ceramic coating is formed on only the area of the mating surfaces adjacent to the hole and the area of the mating surfaces adjacent to the outer surface of the carbon component, and FIG. 5D is a schematic view of the carbon component according to an illustrative embodiment of the present invention, in which a ceramic coating is not formed on the mating surfaces.

FIGS. 5A, 5B, and 5C show examples of the ceramic coating formed on the mating surfaces.

A coating formed on the outer surface 13 and on the surface of the holes 11 of the carbon members 19 is a ceramic coating 15 and includes at least one of, for instance, a SiC coating, a pyrolytic carbon coating, a BN coating, a TaN coating, and a TaC coating. In particular, the SiC coating, the BN coating, the TaN coating, and the TaC coating are superior to carbon of a base material 37 in terms of corrosion resistance to hydrogen or nitrogen, and therefore, can be preferably utilized. Although pyrolytic carbon is inferior to the ceramic coating 15 of the other types in terms of corrosion resistance but tends to be superior to the same in terms of heat resistance. The pyrolytic carbon is a dense material, and therefore, superior to the graphite base material in terms of corrosion resistance. Additionally, since the pyrolytic carbon is made of carbon, the pyrolytic carbon can be preferably utilized in the case of high temperature. The coating may be configured as a single layer or a plurality of layers. In the case of a plurality of layers, the layers may be a substantially single type or a plurality of different types.

The coating formed on the surface of the hole 11 may be formed by use of any method. However, a coating formed by the CVD method is preferable. Since a dense coating is likely to be formed with the CVD method, carbon of the base material 37 is likely to be blocked from an oxidizing gas or a reactive gas. In the case of the coating including a plurality of layers, all of the layers or only one of the layers may be a CVD coating. In the case of the coating including only one layer of CVD coating, a layer reactively transformed by a CVR (chemical vapor reaction) method may be on a base material side of the coating. In the case where the coating including a CVD layer and a CVR layer is formed from a substantially single element, the CVR layer can act as a buffer layer between the CVD layer and the base material 37, so that the ceramic coating 15 less susceptible to separation is likely to be formed. Since the CVR layer is resultant from reactive transformation of graphite, the CVR layer is likely to be joined strongly to the graphite base material. Additionally, the graphite base material is substantially identical with a CVR layer formed on a front surface layer of the coating in terms of thermal expansion coefficient, and therefore, the coating can be less likely to be separated.

The susceptor 100 has the mating surface 23 substantially parallel to the axis of the hole 11. Since the susceptor has the mating surface 23 substantially parallel to the axis of the hole 11, the elongated hole can be made by shallowly grooving the mating surface side of the carbon member and joining the thus-grooved carbon members together. Therefore, the elongated hole is likely to be readily formed without causing the holes to bent, or a cutting tool to be broken when compared with a case where the hole is bored with a drill.

The ceramic coating 15 can be omitted from the mating surfaces as shown in FIG. 5D. However, as shown in FIGS. 5A, 5B, and 5C, forming the ceramic coating even on the mating surfaces 23 may be desirable since the carbon base material is likely to be protected from a reactive gas entering the mating surfaces 23 from the outer surface 13. Moreover, as shown in FIGS. 5B and 5C, the ceramic coating 15 is preferably formed in only the area of the mating surfaces adjacent to the hole or the area of the mating surfaces adjacent to the outer surface of the susceptor 100 rather than being formed over the entire mating surfaces. Since the carbon base material that is porous remains exposed on each of the mating surfaces, a heat resistant adhesive is likely to penetrate into the inside of the base material, so that strong adhesive force is likely to be obtained. In addition, since the ceramic coating is formed in only the area of the respective mating surfaces adjacent to the hole and the area of the same adjacent to the outer surface of the susceptor 100, the graphite base material is less likely to contact the reactive gas, to thus protect the graphite base material from the reactive gas. Thus, occurrence of particles is likely to be reduced or prevented.

The carbon members 19 are joined together by means of a heat resistant adhesive. As a result of the mating surfaces 23 of the respective carbon members 19 being joined together by means of a heat resistant adhesive, the joined portion is sandwiched between the carbon members coated with the ceramic coating so as not to come out on the outer surface or the inner surface. The joined portion and the base material hardly contact the oxidizing gas or the decomposable gas, so that a possibility of occurrence of thickness reduction is likely to become small. A carbon-based adhesive layer, a SiC-based adhesive layer, or the like, may be preferably utilized for the adhesive. The heat resistant adhesive can be cured when subjected to heat treatment at about 200 to about 300° C. Impurities, like organic components, are removed by subjecting the adhesive to heat treatment of about 1000 to about 1500° C. without inflicting damage to the ceramic coating.

An amount of impurity content in the base material 37 of the carbon members is preferably about 20 ppm or less. When the impurity content is about 20 ppm or less, the carbon base material is hardly oxidized and decomposed by catalytic action of impurities and is hardly dissipated. In a case where the carbon members are used for a susceptor, when the impurity content is about 20 ppm or less, the impurities is less likely to spread in the CVD furnace and separated particles by exhaustion is less likely to spread to thereby less adversely affect the wafers during epitaxial growth.

The susceptor 100 is not limited to a specific application but may be preferably utilized for a CVD system for manufacturing semiconductors. According to an illustrative embodiment of the present invention, the coating film is formed even in the hole, and therefore, the inner surface of the hole is less likely to be subjected to thickness reduction by wastage, and there becomes little possibility of scattering of particles in the system.

The susceptor 100 may preferably be utilized for a CVD system for epitaxial growth of silicon, a compound semiconductor, and an SiC semiconductor. Hydrogen is often used as a carrier gas for epitaxial growth and spreads at high speed. For these reasons, hydrogen easily enters the interior of the elongated hole, and the base material 37 has to be blocked from hydrogen. However, according to an illustrative embodiment of the present invention, the ceramic coating is formed on the surface of the hole. In particular, the carbon base material becomes easily deteriorated during epitaxial growth of a compound semiconductor and a SiC semiconductor. Therefore, the susceptor 100 according to an illustrative embodiment of the present invention can preferably be utilized for those systems.

Thus, the carbon component according to an illustrative embodiment of the present invention is preferably the susceptor 100 since the susceptor 100 directly contacts the wafer, and further, a gas supplying port for levitating the wafer carrier is provided in the component. Therefore, there is a high possibility of the wafer being adversely affected by wearing of the interior of the hole.

The susceptor 100 according to an illustrative embodiment of the present invention may be manufactured as follows.

FIGS. 6A to 6D are descriptive process flows showing procedures of a method for manufacturing the carbon component according to an illustrative embodiment of the present invention.

(Formation of the Mating Surfaces)

A set of carbon members 19 each having the mating surface 23 is manufactured (prepared) from a graphite material. The respective separated carbon members 19 may have a sandwich structure in which the carbon members have the substantially same size. Alternatively, the carbon members may have a fitting structure in which one of the carbon members is larger, and the other one is smaller and fit into the larger carbon member.

(Grooving)

Figure 6A:
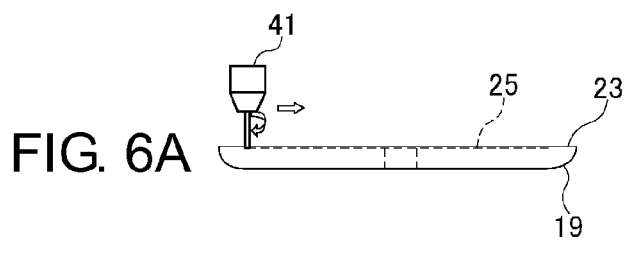
FIGS. 6A to 6D are descriptive process views showing procedures of a method for manufacturing the carbon component according to an illustrative embodiment of the present invention.
Figure 6A:
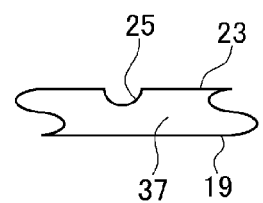

As shown in FIG. 6A, the grooves 25 are formed in at least one of the mating surfaces 23 of the carbon members 19 serving as the base materials 37. The grooves 25 may have any shape. When each of the carbon members 19 is machined by means of a ball end mill 41, the substantially circular or substantially elongated hole 11 can be formed by joining the carbon members together. Alternatively, when a (flat) end mill is used, the rectangular hole 11 can be formed by joining the carbon members together. In this case, both sides of each of the separated carbon members 19 may be machined, or the rectangular hole 11 may be produced by use of only one side of the separated carbon members 19.

(Purification)

Figure 6B:
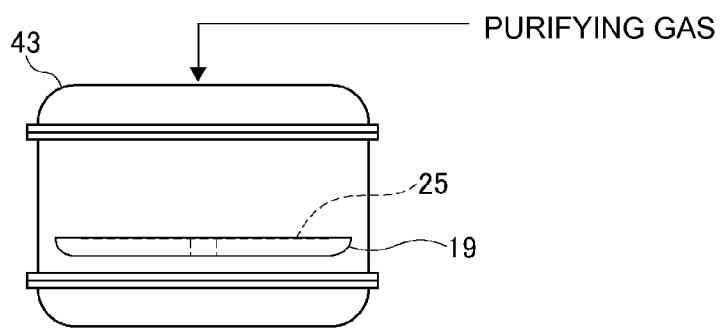

It is desirable to supply a purifying gas (chlorine, a halogen gas, a halogen-based gas, or the like) to an inside of a purifying furnace 43 shown in FIG. 6B before the present stage, to thus remove impurities from the carbon members 19 to enhance purity of the same. The reason for this is that, if the purification of the carbon members is performed at a coating step to be described later or any subsequent step, a produced coating will be removed as a result of purification. Purification may be performed before the step of forming the mating surfaces 23 (i.e., at material stage), however, it is desirable to perform purification after grooving. When purification is performed at the material stage, the grooving step raises a concern about the carbon members being contaminated by a processing machine. Further, a machining step involves a possibility of the carbon members frequently contacting the base material 37, to thus contaminate the base material 37.

(First Coating Step)

Figure 6C:
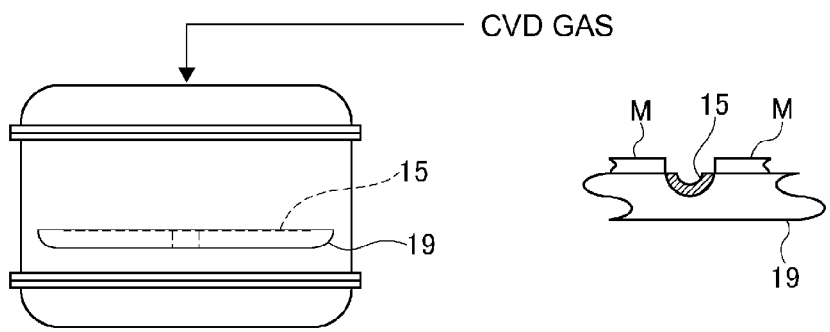
Figure 6C:
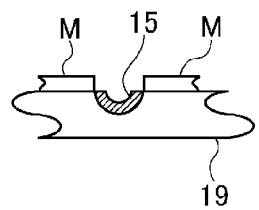

As shown in FIG. 6C, a source gas (a silane-based gas and a hydrocarbon-based gas for a SiC coating, an organic tantalum gas and a hydrocarbon-based gas, or the like, for a TaC coating) is supplied into the purifying furnace 43, whereby the ceramic coating 15 is formed on the inner surface of the thus-formed groove 25. When a coating is formed only on the inner surface of the groove 25, the mating surface 23 is applied with masking M. When the area of the mating surfaces 23 adjacent to the grooves 25 is coated, the mating surfaces 23 are applied with masking M while the area of the mating surfaces 23 adjacent to the grooves 25 remain left. When a coating is formed over the entire mating surfaces 23, the mating surfaces 23 does not need to be applied with masking M. The grooves 25 and the area of the carbon members except the mating surfaces may be coated at this stage or at another stage. When the groove 25 and the area other than the mating surfaces are coated at another stage, the groove 25 and the area other than the mating surfaces may also be masked or may not be masked. When the grooves 25 and the area other than the mating surfaces are coated in the first coating process, the area is not masked.

Figure 7:
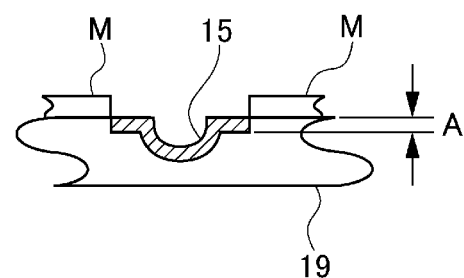
FIG. 7 is a schematic view of the carbon component, in which the mating surface adjacent to a groove is thickness-reduced by an amount equal to a thickness of a coating layer of the ceramic coating.

When the groove 25 and the area of the mating surface 23 adjacent to the groove 25 or the area of the mating surfaces adjacent to the outer surface of the susceptor 100 are coated, it may be better to machine the mating surfaces 23 to be coated by previously reducing the thickness of the mating surfaces 23 by an amount equal to a thickness A of the coating layer as shown in FIG. 7. When a coating is formed in a portion of the area of the mating surfaces, only the coated area of the mating surfaces is likely to contact each other, so that a gap is likely to be generated between the carbon base materials, to thus decrease joining strength.

(Joining Step)

Figure 6D:
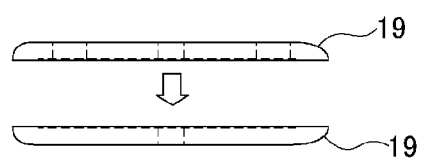
Figure 6D:
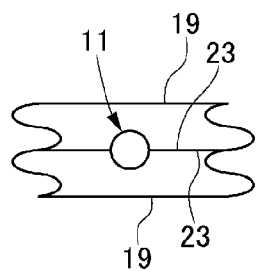

As shown in FIG. 6D, the two separated carbon members 19 produced as mentioned above are joined together, to thus form the susceptor 100. Any adhesive may be used. For instance, in the case of COPNA resin, the resin is applied over the mating surfaces 23, and the mating surfaces 23 are tightly joined under pressure. The thus joined carbon members are cured at about 150° C. for about 60 minutes and subsequently carbonized at about 1000° C. to about 1500° C. in an inert atmosphere. When the carbon members are carbonized at about 1000° C. or more, impurities primarily including organic components are likely to become dispersed, so that a highly purified adhesive layer can be obtained. When the temperature is 1500° C. or less, the ceramic coating film will be less deteriorated or less thermally contracted, to thus become less likely to be cracked.

(Second Coating Step)

In order to smooth the mating surfaces 23 after joining of the carbon members 19, the mating surfaces may be again coated. In a second coating step, a coating is formed over the mating surfaces 23, and therefore, the mating surfaces 23 can be sealed, to thus be likely to be protected from intrusion of a reactive gas from the outer surface of the susceptor 100.

Accordingly, in the above manufacturing method, it is possible to reliably form the ceramic coating 15 on the groove 25 of one carbon member 19 and the mating portion 27 of the other carbon member 19, which opposes the groove 25 while the carbon members 19 are separated from each other. Specifically, since the entire interior of the hole 11 is opened, the concentration of the source gas supplied is less likely to be reduced, and therefore, even when the elongated hole has a large depth (length), the ceramic coating 15 is likely to be substantially uniformly and reliably formed.

Moreover, in the susceptor 100, the ceramic coating is likely to be surely formed on the interior of the elongated hole. Therefore, the carbon members can be used without being deteriorated even in the oxidizing gas or the decomposable gas. Since carbon particles are less likely to be produced within the CVD system, wafers including no or few defects can be obtained.

What is claimed is:

1. A carbon component comprising:
a first carbon plate member having a first mating surface, a first outer surface other than the first mating surface, and a first groove provided on the first mating surface; and
a second carbon plate member having a second mating surface, a second outer surface other than the second mating surface, and a second groove provided on the second mating surface,
wherein the first carbon plate member is connected to the second carbon plate member so that the first mating surface is in contact with the second mating surface and the fits groove and the second groove define a hole extending along the first mating surface and the second mating surface between the first mating surface and the second mating surface, and
wherein the first outer surface, the second outer surface, and an inner surface of the hole are covered with a ceramic coating.

2. The carbon component according to claim 1, wherein the carbon plate members are jointed together by a heat-resistant adhesive.

3. The carbon component according to claim 1, wherein the ceramic coating on the inner surface of the hole is formed so as to extend over the mating surface.

4. The carbon component according to claim 1, wherein the ceramic coating on the inner surface of the hole is formed in a portion of an area of the mating surface adjacent to the hole.

5. The carbon component according to claim 1, wherein a ratio of a length of the hole with respect to a diameter of the hole is about 20 or more.

6. The carbon component according to claim 1, wherein the ceramic coating includes at least one of SiC, pyrolytic carbon, BN TaN and TaC.

7. The carbon component according to claim 1, wherein an amount of impurity content in a base material of the carbon plate members is about 20 ppm or less.

8. The carbon component according to claim 1, wherein the carbon component is a susceptor for epitaxial growth.

9. The carbon component according to claim 1, wherein the first and second carbon plate members comprise a substantially disc-shaped plate member, and
wherein one surface of the plate member has a plurality of wafer mount surfaces arranged at a substantially equal interval along a circumferential direction.

10. The carbon component according to claim 9, wherein the number of wafer mount surfaces is six.

11. The carbon component according to claim 9, wherein the hole extends linearly in a radial direction of the plate member, or extends to cross a substantially circular hole that passes center portions of the wafer mount surfaces.

12. The carbon component according to claim 1, wherein a cross sectional shape of the hole orthogonal to an extending line of the hole is a substantially square shape, a substantially circular shape or a substantially oval shape.

13. The carbon component according to claim 1, wherein a relationship between the hole and the mating surfaces is one of a first relationship where the hole is symmetrically divided by the mating surfaces, a second relationship where the hole is formed in only one of the mating surfaces, and a third relationship where the hole is formed while deviating to one side with respect to the mating surfaces.

14. The carbon component according to claim 1, wherein the mating surface is a flat plane including a center axis of the hole.

15. The carbon component according to claim 9, wherein the mating surface is located at a position where a thickness of the plate member is divided into substantially half.

16. The carbon component according to claim 9, wherein the mating surface is located at a position where a thickness of the plate member is not divided into substantially half.

17. The carbon component according to claim 1, wherein the hole has a shape having a substantially uniform internal diameter, a shape having an opening of a small internal diameter and an interior space of larger internal diameter, or a gourd shape having a narrowed midsection.

18. The carbon component according to claim 6, wherein the ceramic coating includes one of SiC, BN, TaN, and TaC.

19. The carbon component according to claim 1, wherein the ceramic coating is configured as a single layer.

20. The carbon component according to claim 1, wherein the ceramic coating is configured as a plurality of layers.

21. The carbon component according to claim 1, wherein the ceramic coating is formed by CVD method.

22. The carbon component according to claim 20, wherein the plurality of layers has at least one CVD layer and a layer reactively transformed by CVR method on a side of a base material of the carbon plate members.

23. The carbon component according to claim 1, wherein the mating surface is substantially parallel to an axis of the hole.

24. The carbon component according to claim 1, wherein the ceramic coating is formed on the mating surface.

* * * * *